(12) United States Patent
Cha et al.

(10) Patent No.: US 8,552,497 B2
(45) Date of Patent: Oct. 8, 2013

(54) SEMICONDUCTOR DEVICE

(75) Inventors: Jae-Han Cha, Chungcheongbuk-do (KR); Kyung-Ho Lee, Chungcheongbuk-do (KR); Sun-Goo Kim, Chungcheongbuk-do (KR); Hyung-Suk Choi, Chungcheongbuk-do (KR); Ju-Ho Kim, Chungcheongbuk-do (KR); Jin-Young Chae, Chungcheongbuk-do (KR); In-Taek Oh, Chungcheongbuk-do (KR)

(73) Assignee: Magnachip Semiconductor, Ltd. (KR)

( * ) Notice: Subject to any disclaimer, the term of this patent is extended or adjusted under 35 U.S.C. 154(b) by 12 days.

(21) Appl. No.: 13/290,535

(22) Filed: Nov. 7, 2011

(65) Prior Publication Data
US 2012/0049278 A1 Mar. 1, 2012

Related U.S. Application Data

(62) Division of application No. 12/836,503, filed on Jul. 14, 2010, now Pat. No. 8,076,726.

(30) Foreign Application Priority Data

Dec. 4, 2009 (KR) .......................... 10-2009-0120005

(51) Int. Cl.
*H01L 29/66* (2006.01)

(52) U.S. Cl.
USPC .................................... 257/343; 257/E29.256

(58) Field of Classification Search
USPC ........................................... 257/343, E29.256
See application file for complete search history.

(56) References Cited

U.S. PATENT DOCUMENTS

| 5,591,657 | A | 1/1997 | Fujishima et al. |
| 5,739,061 | A | 4/1998 | Kitamura et al. |
| 7,851,314 | B2 | 12/2010 | Mallikarjunaswamy et al. |
| 2002/0137292 | A1 | 9/2002 | Hossain et al. |
| 2011/0079846 | A1* | 4/2011 | Yao et al. ...................... 257/335 |

FOREIGN PATENT DOCUMENTS

JP 07-307401 11/1995

* cited by examiner

*Primary Examiner* — Marvin Payen
(74) *Attorney, Agent, or Firm* — Blakely Sokoloff Taylor & Zafman

(57) ABSTRACT

The semiconductor device includes: a first conductive-type first well and a second conductive-type second well configured over a substrate to contact each other; a second conductive-type anti-diffusion region configured in an interface where the first conductive-type first well contacts the second conductive-type second well over the substrate; and a gate electrode configured to simultaneously cross the first conductive-type first well, the second conductive-type anti-diffusion region, and the second conductive-type second well over the substrate.

5 Claims, 2 Drawing Sheets

SEMICONDUCTOR DEVICE

CROSS-REFERENCE TO RELATED APPLICATIONS

The present patent application is a divisional application claiming the benefit application Ser. No. 12/836,503, filed Jul. 14, 2010, now U.S. Pat. No. 8,076,726, which invention claims priority of Korean Patent Application No. 10-2009-120005, filed on Dec. 4, 2009, which is incorporated herein by reference in its entirety.

BACKGROUND OF THE INVENTION

1. Field of the Invention

Exemplary embodiments of the present invention relates to a method for fabricating a semiconductor device, and, more particularly, to a high-voltage semiconductor device.

2. Description of Related Art

In general, integrated, circuits each including more than one high-voltage transistors arrayed on a chip along with low-voltage circuits are widely used in diverse electrical application fields. Among the high-voltage semiconductor devices which hold significant positions in the integrated circuits are an extended drain MOS (EDMOS) transistor and a laterally double diffused MOS (LDMOS) transistor.

It is well known that resistivity or specific on resistance RSP should be decreased in order to improve an operation characteristic of a high-voltage semiconductor devise.

FIG. 1 is a cross-sectional view illustrating conventional EDMOS transistor. In the drawing, an EDMOS transistor having an N channel is exemplarily illustrated.

Referring to FIG. 1, the conventional EDMOS transistor includes a P-type first well 12 and an N-type second well 13 formed over a substrate 11 with a device isolation layer 18 formed therein to contact each other, a gate electrode 12 simultaneously crossing the P-type first well 12 and the N-type second well 13 over the substrate 11, a gate insulation layer 16 interposed between the gate electrode 17 and the substrate 11, an N-type source region 14 formed over the P-type first well 12 on one side of the gate electrode 17, an N-type drain region 19 formed over the N-type second well 13 on another side of the gate electrode 17, and a P-type pickup region 15 formed over the P-type first well 12.

In an EDMOS transistor having the above structure, a specific on resistance RSP is defined as a multiplication of an on resistance RON by a half-pitch HP, which is the length of the transistor, by the width W of the transistor (RSP=RON× HP×w). Herein, the half-pitch HP is defined as a distance from the N-type source region 14 to the N-type drain region 19, and the on resistance RON is defined as a summation of a channel resistance RCH of a channel region C, an accumulation resistance RACC of an accumulation region A, a drift resistance RDRIFT of a drift region D, and other resistances REST of the other regions (RON=RCH+RACC+RDRIFT+ REXT).

However, a conventional semiconductor device characteristic has its channel resistance RCH increasing in direct proportion to an of channel length. For this reason, when the effective channel length increases, the channel resistance RCH increases as well to thereby increase the specific on resistance RSP.

In particular, the P-type first well 12 and the N-type second well 13 for a high-voltage semiconductor device are formed by sequentially performing an ion implantation process and a thermal treatment for activating implanted impurities. However, since the P-type first well 12 and the N-type second well 13 have different conductive types, an increase in the effective channel length originating from the lateral diffusion of the impurities implanted during the thermal treatment function as a direct cause for deteriorated on resistance RON. To be specific, due to the difference in the lateral diffusion speeds of the impurities implanted into the P-type first well 12 and the N-type second well 13 during the thermal treatment for forming the 2-type first well 12 and the N-type second well 13, the position of the interface between the P-type first well 12 and the N-type second well 13 moves toward the ft type second well 13 from a predetermined position to thereby increase the effective channel length. As the effective channel length increases, the on resistance RON characteristic is deteriorated, which is problematic.

The deterioration in the on resistance RON caused by the lateral, diffusion is accelerated during a subsequent thermal treatment, and not only the EDMOS transistor but also an LDMOS transistor have the same problem or deteriorated on resistance RON caused by the lateral diffusion.

SUMMARY OF THE INVENTION

An embodiment of the present invention devised to resolve the above problems of conventional technology is directed to a high-voltage semiconductor device that can reduce a specific on resistance RSP.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with en embodiment of the present invention, a semiconductor device includes: a first conductive-type first well and a second conductive-type second well configured over a substrate to contact each other; a second conductive-type anti-diffusion region configured in an interface where the first conductive-type first well contacts the second conductive-type second well over the substrate; and a gate electrode configured to simultaneously cross the first conductive-type first well, the second conductive-type anti-diffusion region, and the second conductive-type second well over the substrate.

The second conductive-type anti-diffusion region may be formed over the first conductive-type first well to contact the interface where the first conductive-type first well contacts the second conductive-type second well. An impurity doping concentration of the second conductive-type anti-diffusion region may be higher than impurity doping concentrations of the first conductive-type first well and the second conductive-type second well.

The semiconductor device further includes: a device isolation layer configured over the substrate; a second conductive-type source region configured over the first conductive-type first well to be arrayed at one end of one side of the gate electrode; and a second conductive-type drain region configured over the second conductive-type second well to be spaced apart from one end of another side of the gate electrode by a predetermined distance.

The second conductive-type anti-diffusion region may be fully depleted based on a voltage supplied to the second conductive-type drain region. The device isolation layer positioned between the gate electrode and the second conductive-type drain region may be partially overlapped with a lower portion of the gate electrode.

In accordance with another embodiment of the present invention, a semiconductor device includes: a second conductive-type deep well configured over a substrate; a first conductive-type well configured over the second conductive-type deep well; a second conductive-type anti-diffusion region configured in the second conductive-type deep well to contact a sidewall of the first conductive-type well; and a gate electrode configured to simultaneously cross the first conductive-type well, the second conductive-type anti-diffusion region, and the second conductive-type deep well over the substrate.

An impurity doping concentration of the anti-diffusion region may be higher than impurity doping concentrations of the second conductive-type deep well and the first conductive-type well.

The semiconductor device may further include: a device isolation layer configured over the substrate; a second conductive-type source region configured over the first conductive-type well to be arrayed at one end of one side of the gate electrode; and a second conductive-type drain region configured over the second conductive-type deep well to be spaced apart from one end of another side of the gate electrode by a predetermined distance.

The second conductive-type anti-diffusion region may be fully depleted based on a voltage supplied to the second conductive-type drain region. The device isolation layer positioned between the gate electrode and the second conductive-type drain region may be partially overlapped with a lower portion of the gate electrode.

DESCRIPTION OF SPECIFIC EMBODIMENTS

Figure 1:
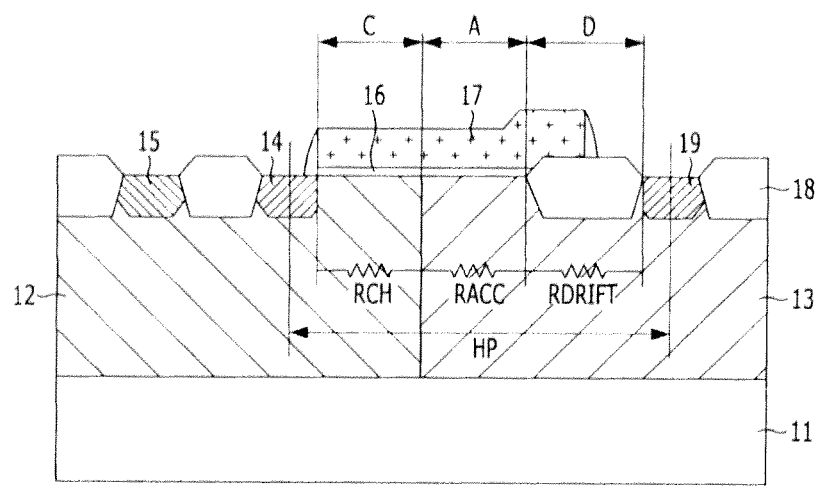
FIG. 1 is a cross-sectional view illustrating conventional EDMOS transistor.

Exemplary embodiments of the present invention will be described below in more derail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. The drawings are not necessarily to scale and in some instances, proportions may have been exaggerated in order to clearly illustrate features of the embodiments. When a first layer is referred to as being "on" a second layer or "on" substrate, it not only refers to a case where the first layer is formed directly on the second layer or the substrate but also a case where a third layer exists between the first layer and the second layer or the substrate.

Embodiments of the present invention provide a high-voltage semiconductor device capable of reducing its resistivity or specific on resistance RSP. To this end, the technology of the present invention provides an anti-diffusion region for preventing an effective channel length from increasing during a semiconductor fabrication process, in particular, a thermal treatment.

In the following embodiments of the present invention, the technological spirit and concept of the present invention are exemplarily applied to a laterally double diffused MOS (LDMOS) transistor and an extended drain MOS (EDMOS) transistor having an N channel. In the embodiments to be described below, a first conductive type is a P type, and a second conductive type is an N type. Of course, the technological spirit and concept of the present invention may be equally applied to an LDMOS transistor and an EDMOS transistor having a P channel. In this case, a first conductive type is an N type, and a second conductive type is a P type.

$1^{ST}$ Embodiment

Hereafter, a first embodiment where the technological spirit and concept of the present invention are exemplarily applied to an EDMOS transistor will be described.

Figure 2:
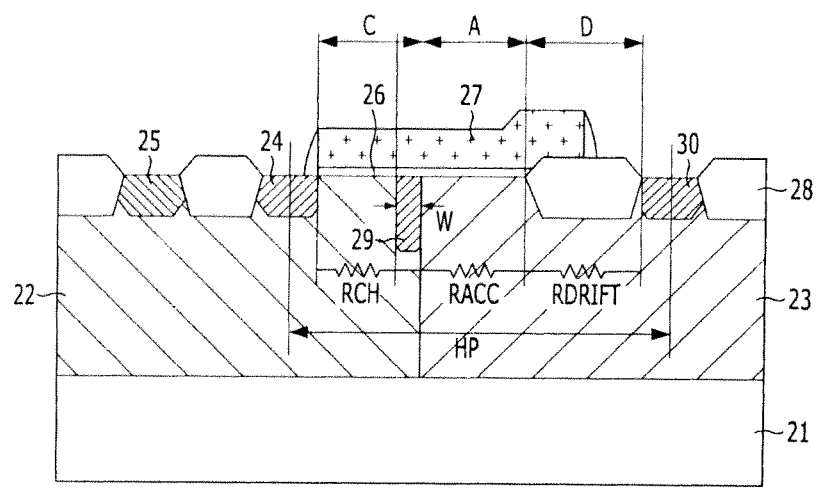
FIG. 2 is a cross-sectional view illustrating a semiconductor device in accordance with a first embodiment of the present invention.

FIG. 2 is a cross-sectional view illustrating a semiconductor device in accordance with the first embodiment of the present invention. Referring to FIG. 2, the semiconductor device fabricated in accordance with the first embodiment of the present invention includes a first conductive type first well 22 and a second conductive-type second well 23, a second conductive-type anti-diffusion region 29, a gate electrode 27, a gate insulation layer 26, second conductive-type source region 24, a second conductive-type drain region 30, and a first conductive-type pickup region 25.

The first conductive-type first well 22 and the second conductive-type second well 23 are formed over a substrate 21 provided with a device isolation layer 26. The second conductive type anti-diffusion region 29 is formed in the interface between the first conductive-type first well 22 and the second conductive-type second well 23 over the substrate 21. The gate electrode 27 simultaneously crosses the first conductive-type first well 22, the second conductive-type anti-diffusion region 29, and the second conductive-type second well 23 over the substrate 21. The gate insulation layer 26 is interposed between the gate electrode 27 and the substrate 21. The second conductive-type source region 24 is formed ever the first conductive-type first well 22 to be arrayed at one end of one side of the gate electrode 27. The second conductive-type drain region 30 is formed ever the second conductive-type second well 23 by being spaced apart from one end of another side of the gate electrode 27 by a predetermined distance. The first conductive-type pickup region 25 is formed over the first conductive-type first well 22. Herein, the device isolation layer 28 positioned between the gate electrode 27 and the second conductive-type drain region 30 may have a structure where the device isolation layer 28 is partially overlapped with a lower portion of the gate electrode 27.

In the EDMOS transistor having the above-described structure, a specific on resistance RSP is defined as a multiplication of an on resistance RON by a half-pitch HP, which is the length of a transistor, by the width W of the transistor (RSP=RON×HP×W). Herein, the half-pitch HP is defined as a distance from the second conductive-type source region 24 to the second conductive-type drain region 30. The on resistance RON is defined as a summation of a channel resistance RCH of a channel region C, an accumulation resistance RACC of an accumulation region A, a drift resistance RDRIFT of a drift region D, and other resistances REXT of the other regions (RON=RCH+RACC+RDRIFT+REXT). Herein, the channel region C denotes an area where the gate electrode 27 and the first conductive-type first well 22 are overlapped, and the accumulation region A is an area where the gate electrode 27 and the second conductive-type second well 23 are overlapped. The drift region D denotes an area where, the device isolation layer 28, which is disposed between the gate electrode 27 and the second conductive-type drain region 30, is overlapped with the second conductive-type second well 23.

Herein, in order to prevent an effective channel length caused by lateral diffusion of impurities during a semiconductor device fabrication process, in particular, a thermal treatment, from increasing, that is, in order to prevent the interface between the first conductive-type first well 22 and the second conductive-type second well 23 from moving toward the second conductive-type second well 23, the impurity doping concentration of the second conductive-type anti-diffusion region 29 formed in the interface between the first conductive-type first well 22 and the second conductive-type second well 23 may be higher than an impurity doping concentration of the first conductive-type first well 22. This is to prevent an effective channel length from increasing by consuming all the impurities diffused into the second conductive-type anti-diffusion region 29 through a counter-doping, when the impurities doping the channel region C are diffused into the second conductive-type anti-diffusion region 29 during the semiconductor device fabrication process. In order to effectively prevent the effective channel length from increasing through the counter-doping of the second conductive-type anti-diffusion region 29, the second conductive-type anti-diffusion region 29 may be positioned in the first conductive-type first well 22 to contact the interface between the first conductive-type first well 22 and the second conductive-type second well 23.

It is desirable that the impurity doping concentration of the second conductive-type anti-diffusion region 29 is higher than the impurity doping concentration of the second conductive-type second well 23. This is because the second conductive-type anti-diffusion region 29 and the second conductive-type second well 23 have the some conductive type and thus the second conductive-type anti-diffusion region 29 functions as an accumulation region A during an operation. To be specific, since the second conductive-type anti-diffusion region 29 has a higher impurity concentration than the second conductive-type second well 23, it is possible to increase the impurity doping concentration of the accumulation region A, compared with a case where the accumulation region A is formed only of the second conductive-type second well 23. Therefore, it is possible to reduce the accumulation resistance RACC.

Also, the second conductive-type an region 29 may be formed to have a linewidth W that makes the second conductive-type anti-diffusion region 29 fully depleted based on a voltage supplied to the second conductive-type drain region 30 during an operation. This is to prevent a breakdown voltage characteristic from being deteriorated due to the second conductive-type anti-diffusion region 29. When the second conductive-type anti-diffusion region 29 is not completely depleted based on the voltage applied to the second conductive-type drain region 30 during an operatic the breakdown voltage characteristic of the semiconductor device is determined based on a PN diode characteristic between the first conductive-type first well 22 and the second conductive-type anti-diffusion region 29 having a higher impurity doping concentration than the first conductive-type first well 22 and the second conductive-type second well 23. The breakdown voltage characteristic may be deteriorated due to the second conductive-type anti-diffusion region 29 having a higher impurity doping concentration than the impurity doping concentrations of the first conductive-type first well 22 and the second conductive-type second well 23.

As described above, the semiconductor device fabricated according to the first embodiment of the present invention can effectively prevent the effective channel length caused by lateral diffusion of the impurities during a semiconductor device fabrication process, in particular, a thermal treatment, from increasing by including the second conductive-type anti-diffusion region 29. The suppression in the increase of the effective channel length also effectively prevents the on resistance RON from increasing. Also, with the second conductive-type anti-diffusion region 29, it is possible to reduce the accumulation resistance RACC of the accumulation region A.

In consequences, the semiconductor device fabricated according to the first embodiment of the present invention can reduce the specific on resistance ROP of the semiconductor device by including the second conductive-type anti-diffusion region 29.

$2^{ND}$ Embodiment

Hereafter, a second embodiment where the technological spirit and concept of the present invention are exemplarily applied to an EDMOS transistor will be described.

Figure 3:
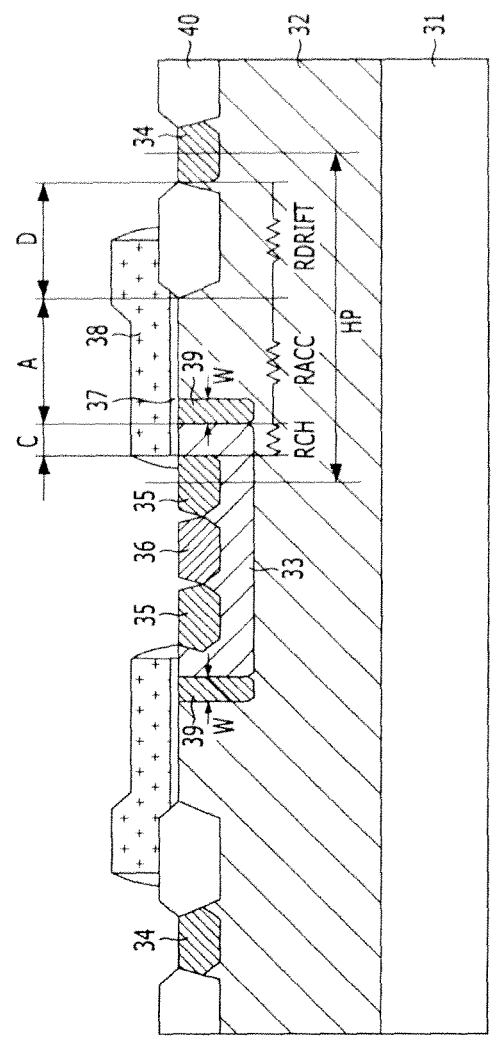
FIG. 3 is a cross-sectional view illustrating a semiconductor device in accordance with a second embodiment of the present invention.

FIG. 3 is a cross-sectional view illustrating a semiconductor device in accordance with the second embodiment of the present invention. The drawing shows a case where two LDMOS transistors are arrayed in light and left symmetrical structure based on a pickup region.

Referring to FIG. 3, the semiconductor device fabricated in accordance with the second embodiment of the present invention includes a second conductive-type deep well 32, first conductive-type well 33, a second conductive-type anti-diffusion region 39, a gate electrode 38, a gate insulation layer 37, a second conductive-type source region 35, a first conductive-type pickup region 36, and a second conductive-type drain region 34.

The second conductive-type deep well 32 is formed over a substrate 31 provided with a device isolation layer 40. The first conductive-type well 33 is formed in the second conductive-type deep well 32. The second conductive-type anti-diffusion region 39 is formed in the second conductive-type deep well 32 to contact a sidewall of the first conductive-type well 33. The gate electrode 38 simultaneously crosses the first conductive-type well 33, the second conductive-type anti-diffusion region 39, and the second conductive-type deep well 32. The gate insulation layer 37 is interposed between the gate electrode 38 and the substrate 31. The second conductive-type source region 35 is formed over the first conductive-type well 33 to be arrayed at one end of one side of the gate electrode 38. The first conductive-type pickup region 36 is formed over the first conductive-type well 33. The second conductive-type drain region 34 is formed over the second conductive-type deep well 32 by being spaced apart from one and of another side of the gate electrode 38 by a predetermined distance. Herein, the device isolation layer 40 positioned between the gate electrode 38 and the second conductive-type drain region 34 may have a structure where the device isolation layer 40 is partially overlapped with a lower portion of the gate electrode 38.

In the LDMOS transistor having the above-described structure, a specific on resistance ROT is defined as a multiplication of an on resistance RON by a half-pitch HP, which is the length of a transistor, by the width W of the transistor (RSP=RON×HP×W). Herein, the half-pitch HP is defined as a distance from the second conductive-type source region 35 to the second conductive-type drain region 34. The on resistance RON is defined as a summation of a channel resistance RCH of a channel region C, an accumulation resistance RACC of an accumulation region A, a drift resistance RDRIFT of a drift region D, and other resistances REXT of the other regions (RON=RCH+RACC+RDRIFT+REXT). Herein, the channel region C denotes an area where the gate electrode 38 and the first conductive-type well 33 are overlapped, and the accumulation region A is an area where the gate electrode 38 and the second conductive-type deep well 32 are overlapped. The drift region D denotes an area where the device isolation layer 40, which is disposed between the gate electrode 38 and the second conductive-type drain region 34, is overlapped with the second conductive-type deep well 32.

Herein, in order to prevent an effective channel length caused by lateral diffusion of impurities during a semiconductor device fabrication process, in particular, a thermal treatment, from increasing, that is, in order to prevent the line width of the first conductive-type well 33 from increasing more than a predetermined line width due to lateral diffusion, the impurity doping concentration of the second conductive-type anti-diffusion region 39 formed to contact a sidewall of the first conductive-type well 33 may be higher than an impurity doping concentration of the first conductive-type well 33. This is to prevent an effective channel length from increasing by consuming all the impurities diffused into the second conductive-type anti-diffusion region 39 through a counter-doping when the impurities doping the channel region C are diffused into the second conductive-type anti-diffusion region 39 during the semiconductor device fabrication process.

It is desirable that the impurity doping concentration of the second conductive-type anti-diffusion region 39 is higher than the impurity doping concentration of the second conductive-type deep well 32. This is because the second conductive-type anti-diffusion region 39 and the second conductive type deep well 32 have the same conductive type and thus the second conductive-type anti-diffusion region 39 functions as an accumulation region A during an operation. To be specific, since the second conductive-type anti-diffusion region 39 has a higher impurity concentration than the second conductive-type deep well 32, it is possible to increase the impurity doping concentration of the accumulation region A, compared with a case where the accumulation region A is formed only of the second conductive-type deep well 32. Therefore, it is possible to reduce the accumulation resistance RACC.

Also, the second conductive-type anti-diffusion region 39 may be formed to have a linewidth W that makes the second conductive-type anti-diffusion region 39 fully depleted based on a voltage supplied to the second conductive-type drain region 34 during an operation. This is to prevent a breakdown voltage characteristic from being deteriorated due to the second conductive-type all region 39. When the second conductive-type anti-diffusion region 39 is not completely depleted based on the voltage applied to the second conductive-type drain region 34 during an operation, the breakdown voltage characteristic of the semiconductor device is determined based on a PN diode characteristic between the first conductive-type well 33 and the second conductive-type anti-diffusion region 39 having a higher impurity doping concentration than the second conductive-type deep well 32 and the first conductive-type well 33. The breakdown voltage characteristic may be deteriorated due to the second conductive-type anti-diffusion region 39 having a higher impurity doping concentration than the impurity doping concentrations of the second conductive-type deep well 32 and the first conductive-type well 33.

As described above, the semiconductor device fabricated according to the second embodiment of the present invention can effectively prevent the effective channel length caused by lateral diffusion of the impurities during a semiconductor device fabrication process, in particular, a thermal treatment, from increasing by including the second conductive-type anti-diffusion region 39. The suppression in the increase of the effective channel length also effectively prevents the on resistance RON from increasing. Also, with the second conductive-typo anti-diffusion region 39, it is possible to reduce the accumulation resistance RACC of the accumulation region A.

In consequences, the semiconductor device fabricated according to the second embodiment of the present invention can reduce the specific on resistance RSP of the semiconductor device by including the second conductive-type anti-diffusion region 39.

The technology of the present invention can effectively prevent an effective channel length caused by lateral diffusion of impurities during a thermal treatment from increasing by forming an anti-diffusion region. As a result, it is possible to effectively prevent an on resistance RON from increasing.

Also, with the anti-diffusion region, the technology of the present invention can reduce the size of an accumulation resistance RACC of an accumulation region.

In consequences, the presence of the anti-diffusion region leads to a decreased specific on resistance RSP of a semiconductor device.

While the present invention has teen described with respect to the specific embodiments, it will be apparent to those skilled in the art that various changes and modifications may be made without departing from the spirit and scope of the invention as defined in the tot towing claims.

What is claimed is:

1. A semiconductor device, comprising:
    a second conductive-type deep well configured over a substrate;
    a first conductive-type well configured over the second conductive-type deep well;
    a second conductive-type anti-diffusion region configured in the second conductive-type deep well to contact a sidewall of the first conductive-type well;
    a gate electrode configured to simultaneously cross the first conductive-type well, the second conductive-type anti-diffusion region, and the second conductive-type deep well over the substrate and
    wherein the first conductive type is different from the second conductive type.

2. The semiconductor device of claim 1, wherein an impurity doping concentration of the anti-diffusion region is higher than impurity doping concentrations of the second conductive type deep well and the first conductive-type well.

3. The semiconductor device of claim 1, further comprising:
    a device isolation layer configured over the substrate; a second conductive-type source region configured over the first conductive-type well at one end of one side of the gate electrode; and
    a second conductive-type drain region configured over the second conductive-type deep well and spaced apart from one end of another side of the gate electrode by a predetermined distance.

4. The semiconductor device of claim 3, wherein the second conductive-type anti-diffusion region is fully depleted based on a voltage supplied to the second conductive-type drain region.

5. The semiconductor device of claim 3, wherein the device isolation layer is disposed between the gate electrode and the second conductive-type drain region and partially overlaps a lower portion of the gate electrode.

* * * * *